United States Patent
Nguyen et al.

(10) Patent No.: US 6,944,009 B2
(45) Date of Patent: Sep. 13, 2005

(54) ULTRA BROADBAND CAPACITOR ASSEMBLY

(75) Inventors: John A. Nguyen, Hayward, CA (US); Anand Gundavajhala, Cupertino, CA (US)

(73) Assignee: Oplink Communications, Inc., Fremont, CA (US)

( * ) Notice: Subject to any disclaimer, the term of this patent is extended or adjusted under 35 U.S.C. 154(b) by 0 days.

(21) Appl. No.: 10/777,999

(22) Filed: Feb. 11, 2004

(65) Prior Publication Data

US 2004/0228069 A1 Nov. 18, 2004

Related U.S. Application Data

(60) Provisional application No. 60/446,259, filed on Feb. 11, 2003.

(51) Int. Cl.[7] .................................................. H01G 4/38
(52) U.S. Cl. ....................... 361/328; 361/303; 361/309; 361/311; 361/313; 361/330; 361/308.2
(58) Field of Search ................................. 368/328, 329, 368/330, 303, 305, 308.2, 309, 311, 313, 306.1, 306.3, 321.2, 321.5

(56) References Cited

U.S. PATENT DOCUMENTS

| | | | | |
|---|---|---|---|---|
| 4,290,071 A | * | 9/1981 | Fenwick | 343/819 |
| 5,422,782 A | * | 6/1995 | Hernandez et al. | 361/306.2 |
| 5,424,645 A | * | 6/1995 | Doty | 324/318 |
| 6,614,399 B2 | * | 9/2003 | Trumbull et al. | 343/702 |
| 6,816,356 B2 | * | 11/2004 | Devoe et al. | 361/309 |
| 2004/0130417 A1 | * | 7/2004 | Merenda et al. | 333/247 |

* cited by examiner

*Primary Examiner*—Anthony Dinkins
*Assistant Examiner*—Nguyen T. Ha
(74) *Attorney, Agent, or Firm*—Fish & Richardson P.C.

(57) ABSTRACT

Systems and apparatuses for providing a broadband capacitor assembly. One broadband capacitor assembly includes a first capacitor operable to provide a first end of an operational band of frequencies within an operational band of a broadband capacitor assembly. The broadband capacitor assembly also includes a second capacitor coupled in parallel to the first capacitor, the second capacitor operable to provide a second end of the operational band of frequencies within the operational band of the broadband capacitor assembly. A DC block can be provided including a broadband capacitor assembly.

44 Claims, 2 Drawing Sheets

ULTRA BROADBAND CAPACITOR ASSEMBLY

CROSS-REFERENCE TO RELATED APPLICATIONS

This application claims the benefit of U.S. Provisional Application No. 60/446,259, filed on Feb. 11, 2003, which is incorporated by reference herein.

BACKGROUND

The following specification relates to electronic components. Electrical components operating, for example, at Radio Frequency (RF), microwave and millimeterwave frequencies are typically designed so that the electrical component operates as expected throughout a desired frequency band (or specified operational band). For example, a capacitor can be designed to provide capacitance throughout a specified operational band. However, there are circumstances in which a capacitor in operation will provide inductance to a circuit instead of capacitance. The materials, packaging, and to a large extent the physical structure (i.e. the geometry) of a component contribute intrinsic parasitic resistances, capacitances, and inductances to the make up of the component, which can result in a component not operating as desired.

At different frequencies, component parasitics can dominate component performance. Moreover, parasitics can combine with one another or with other circuit elements to induce undesired changes—such as glitches, nulls, or phase shifts—in signals (narrowband or broadband) traveling through a circuit (or assembly).

Consequently, conventional electrical components are specified and designed to operate over a relatively narrow band within which the parasitics contributed by the geometry, materials, and packaging of a component can be effectively mitigated. For example, most capacitors are designed for operation over a relatively narrow band and may become inductive past a parasitic resonant frequency due to the above identified intrinsic sources of parasitics.

In developing ultra broadband technologies, for example, back-haul systems provided by the use of OC768 optoelectrical equipment, extremely wide bandwidths are specified and designed for despite the existing narrow band limitation imposed by conventional electrical components included in the equipment design. Ultra broadband networks require undistorted handling of signals through the optical and electrical components. Ultra broadband electrical components must therefore operate well over a continuous band of spectrum that extends from the tens of kilohertz (kHz) to the tens (or even hundreds) of gigahertz (GHz).

SUMMARY

The present specification describes systems and apparatuses for providing a broadband capacitor.

In general, in one aspect, the specification provides a broadband capacitor assembly. The broadband capacitor assembly includes a first capacitor operable to provide a first end of an operational band of frequencies within an operational band of a broadband capacitor assembly. The broadband capacitor assembly includes a second capacitor coupled in parallel to the first capacitor, the second capacitor operable to provide a second end of the operational band of frequencies within the operational band of the broadband capacitor assembly.

In general, in another aspect, the specification provides for a DC block. The DC block includes a broadband capacitor assembly. The broadband capacitor assembly includes a first capacitor operable to provide a first end of an operational band of frequencies within an operational band of a broadband capacitor assembly. The broadband capacitor assembly includes a second capacitor coupled in parallel to the first capacitor, the second capacitor operable to provide a second end of the operational band of frequencies within the operational band of the broadband capacitor assembly.

Implementations may include one or more of the following features. The first capacitor can be operable to provide a high frequency end of the operational band of the broadband capacitor assembly. The first capacitor can be operable to provide an intermediary frequency end of the operational band of the broadband capacitor assembly. The second capacitor can be operable to provide a low frequency end of the operational band of the broadband capacitor assembly. The first capacitor can be a beam-lead capacitor. The first capacitor can have a value of substantially 20 pF. The second capacitor can be a multi-layer capacitor. The second capacitor can have a value of substantially 100 nF. The first capacitor can have a high quality factor. The first capacitor can be a thin film capacitor. The first capacitor can include a thin film metallization formed on an alumina substrate. The first capacitor can include a silicon nitride dielectric coupled to a top surface of the thin film metallization. The first capacitor can include a second metal coupled to a top surface of the silicon nitride dielectric.

The broadband capacitor assembly can further include a coplanar waveguide structure defining a transmission path having a signal conductor, wherein the first capacitor and the second capacitor are coupled across a gap formed in the signal conductor along the transmission path. The second capacitor can be positioned below the signal conductor of the coplanar waveguide. The broadband capacitor assembly can further include conductive leads coupled between the second capacitor and the signal conductor operable to couple the second capacitor across the gap formed in the signal conductor along the transmission path. The second capacitor can be positioned above the first capacitor. The broadband capacitor assembly can further include conductive blocks coupled between the signal conductor of the coplanar waveguide and the second capacitor operable to couple the second capacitor across the gap formed in the signal conductor along the transmission path. The second capacitor can be positioned to reduce parasitics that effect a high frequency operation of the first capacitor. The first capacitor can directly contact the signal conductor of the coplanar waveguide. The first capacitor can be a broad side coupled capacitor positioned below a substrate of the coplanar waveguide. The coplanar waveguide can be mounted to a package ground. At least a portion of the coplanar waveguide can be suspended above the package ground by an air gap. The second capacitor can be suspended from a bottom of the coplanar waveguide into a cavity formed in the package ground.

The details of the following specification can be implemented to provide one or more of the following advantages. A broadband capacitor assembly is provided which is capable of providing a desired transmission response with acceptable return loss over a wide frequency range. The broadband capacitor assembly can operate throughout a frequency range from the tens of kilohertz to the tens of gigahertz.

The details of one or more implementations are set forth in the accompanying drawings and the description below.

DESCRIPTION OF DRAWINGS

Like reference symbols in the various drawings indicate like elements.

DETAILED DESCRIPTION

In order to provide a capacitor that maintains a desired value of capacitance from very low frequencies to at least the tens of gigahertz (GHz), an Ultra Broadband Capacitor Assembly (UBCA) is provided. In one implementation, the UBCA operates from low frequencies (e.g., tens of kilohertz) to at least 70 GHz. In another implementation, an UBCA is provided for use with coplanar waveguides (CPWs). One form of coplanar waveguide includes a central signal conductor and two ground conductors arranged to form a ground-signal-ground pattern in a single plane. A small distance separates the ground and signal conductors. The signal and ground conductors can be mounted on a top surface of a substrate. The UBCA structure can provide a capacitance value easily matched to that of the response and dimensions of an appropriate value low frequency capacitor.

Figure 1:
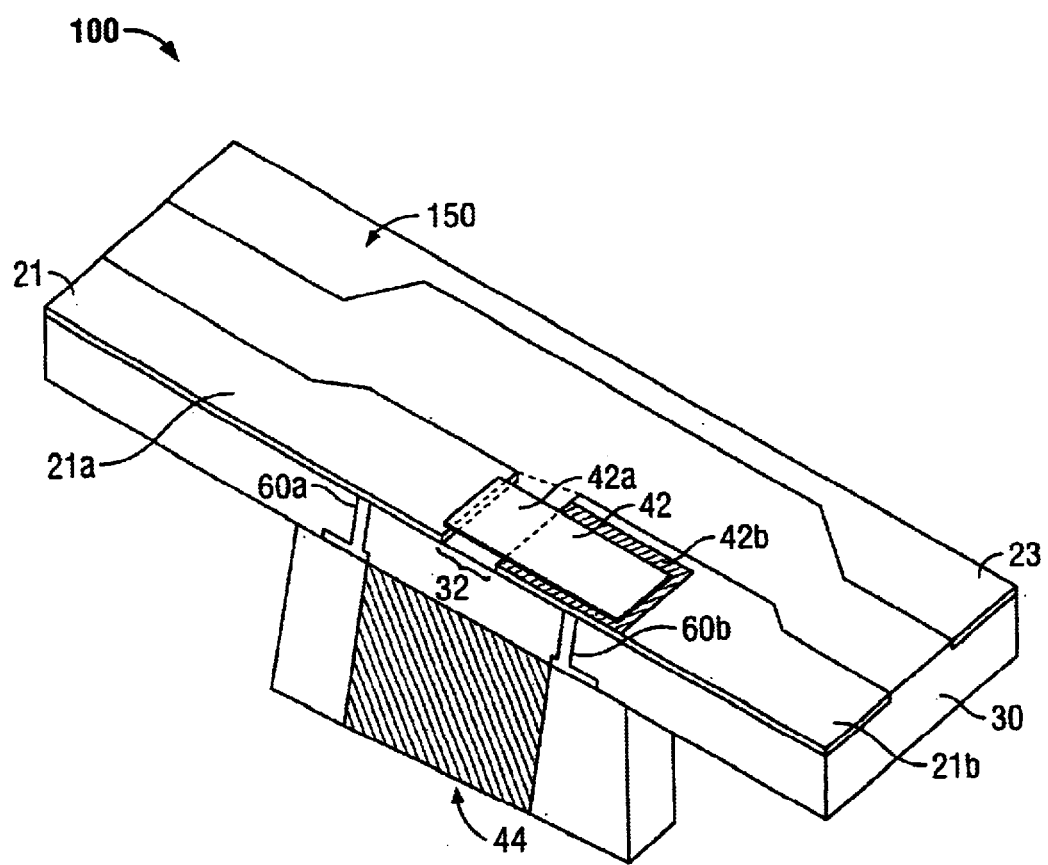
FIG. 1 is a sectional view of an ultra broadband capacitor assembly according to one implementation.

Shown in FIG. 1 is a sectional view of an UBCA 100 according to one implementation. FIG. 1 illustrates UBCA 100 sliced through a plane orthogonal to a signal conductor 21 of a CPW, generally shown at 150, incorporated in the structure of UBCA 100. Also included in structure of CPW 150 is a ground conductor 23 that is one of two ground conductors (the second is not shown) of CPW 150 and a substrate 30 upon which the signal and ground conductors are mounted.

UBCA 100 includes two sections of signal conductor 21 (e.g., signal conductors 21*a* and 21*b*) separated by a gap 32, a first capacitor 42 and a second capacitor 44. In one implementation, gap 32 is a break in signal conductor 21 revealing substrate 30 upon which signal conductor 21 is mounted. The first capacitor 42 includes a conductive strip 42*a* which electrically contacts signal conductor 21*a* on one side of gap 32. Conductive strip 42*a* extends over gap 32 forming a bridge resting atop a dielectric material 42*b* deposited on signal conductor 21*b* on the other side of gap 32. In one implementation, gap 32 is filled with air. The area under dielectric material 42*b* forms the second conductive side of capacitor 42. Second capacitor 44 is affixed to the underside of substrate 30 and is operable to establish electrical contact with signal conductor 21 on both sides of gap 32, for example, through vias 60*a* and 60*b*, which in one implementation, are filled with a conductive material having a low parasitic inductance. In one implementation, a solid conductive material is used to fill vias 60*a* and 60*b* in order to limit inductive effects. The second capacitor 44, can be for example a multi-layer capacitor operable as a high value, low frequency capacitor. For example, the multi-layer capacitor can include a dielectric material sandwiched between two conductive plates. In one implementation, second capacitor 44 has a value of substantially 100 nF.

In one implementation, the value of first capacitor 42 is designed to, in part, set a high end for the operational band of UBCA 100. The highest frequency at which UBCA 100 operates as designed (i.e., as a conductive component) is in part determined by the structure and inherent parasitics of the capacitor. The value of capacitance of first capacitor 42 also sets an intermediary band of spectrum within the operational band that second capacitor 44 should not disturb with its inherent relatively high-frequency parasitics. Thus, the second capacitor 44 can be designed and positioned such that the second capacitor 44 does not interfere with the operation of the first capacitor 42. The intermediary band of spectrum is defined by the lowest frequencies that can pass through first capacitor 42. In one implementation, the quality factor (Q factor) of first capacitor 42 can be very high.

The value of capacitance of second capacitor 44 is designed, in part, to set the lower end of the operational band of UBCA 100. In other words, the highest frequency at which UBCA 100 operates as designed (i.e., as a conductive component) is set in part by the actual value of capacitance of second capacitor 44. The dimensions of second capacitor 44 are designed to limit parasitics stemming from the geometry of second capacitor 44, which can degrade the performance of UBCA 100 at higher frequencies within the operational band and thus limit the high end of the operational band.

The first capacitor 42 can be positioned in close proximity to the signal conductor 21 of CPW 150 to provide the shortest electrical path for high frequency signals. In one implementation, a dielectric paste can be used to separate conductive strip 42*a*, forming a first conductive side of first capacitor 42, from signal conductor 21*b* forming the second conductive side of first capacitor 42. In one implementation, the first capacitor 42 has a capacitance value of substantially 20 pF.

In one implementation, the first capacitor 42 is a beam-lead capacitor. In another implementation, thin film processes can be used to construct a high frequency capacitor, to be used in place of, or in conjunction with, first capacitor 42. In a thin film process implementation, a thin layer of dielectric such as silicon nitride (SiN) is deposited on a top surface of a thin film metallization on an alumina substrate. A second metal is then formed on the top surface of the SiN material sandwiching it in a parallel plate capacitor. The second metal material can be extended to cross the bridge connection to signal conductor 21*a* across gap 32. The high frequency capacitor can be compatible with thin film processes of fabricating CPW transmission line substrate. The SiN dielectric layer can have a thickness on the order of thousands of angstroms resulting in a very high capacitance density. The dielectric material used can be changed, for example to silicon dioxide or polymide, in order to alter the capacitance density for other circuit applications such as use in gain equalizers.

In one implementation, CPW 150 can be mounted onto a carrier or a package ground. When mounting the second capacitor 44 to the bottom side of CPW 150, a cavity can be formed in the package ground to provide an opening for second capacitor 44. The walls of the cavity in the package ground are at an RF ground potential, which can produce a parasitic influence on the UBCA assembly 100. Second capacitor 44 can be positioned away from the walls of the package ground which would, if placed too closely, enable parasitic coupling from second capacitor 44 that would in turn lead to energy leakage from the fundamental mode traveling through CPW 150. Thus, the second capacitor 44 can be suspended from CPW 150 in a cavity formed in the package ground.

Figure 2:
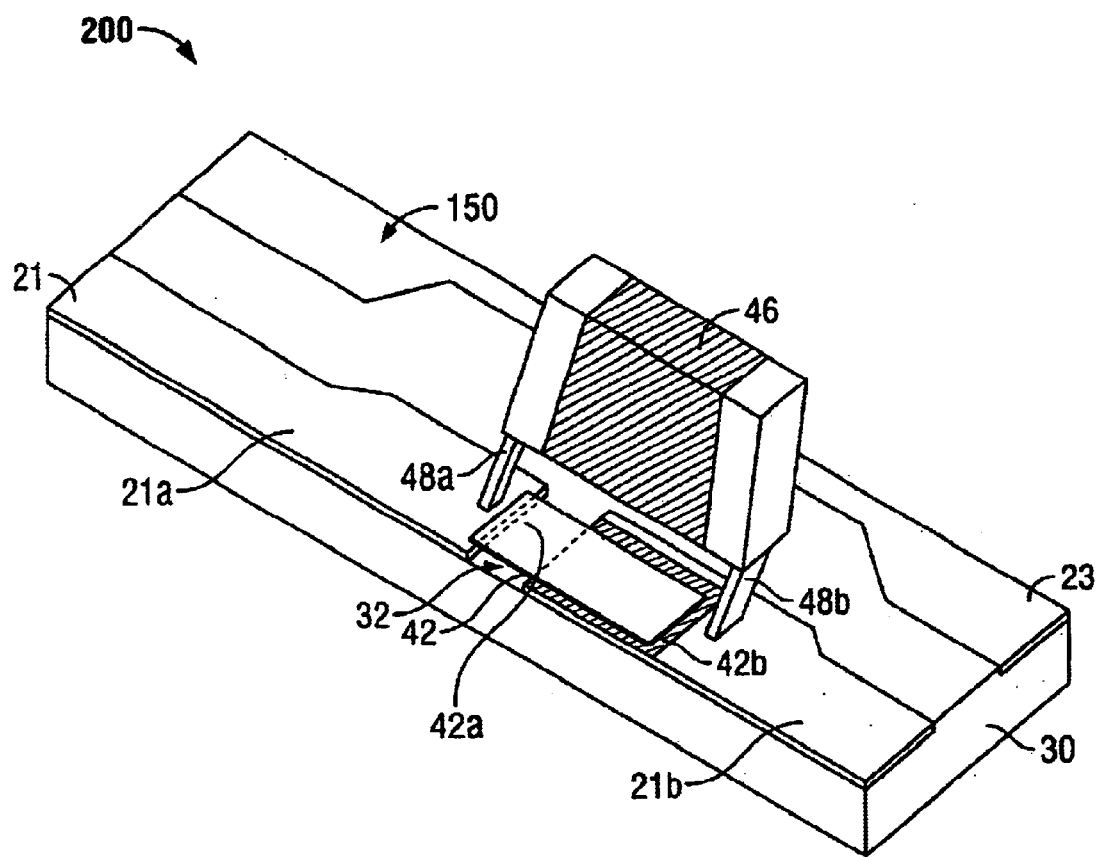
FIG. 2 is a sectional view of an ultra broadband capacitor assembly according to another implementation.

In an alternative implementation the second capacitor can be mounted above the first capacitor. FIG. 2 illustrates a sectional view of a UBCA structure 200 in which a second capacitor 46 is mounted above first capacitor 42. FIG. 2 illustrates UBCA 200 sliced through a plane orthogonal to signal conductor 21. Also included in the structure of CPW 150 is ground conductor 23 and substrate 30, upon which the signal and ground conductors are mounted.

UBCA 200 includes two sections of signal conductor 21 (e.g., signal conductors 21*a* and 21*b*) separated by gap 32, first capacitor 42 and second capacitor 46. In one implementation, gap 32 is a break in signal conductor 21 revealing substrate 30 upon which signal conductor 21 is mounted. The first capacitor 42 includes conductive strip 42a which electrically contacts signal conductor 21a on one side of gap 32. Conductive strip 42a extends over gap 32 forming a bridge resting atop dielectric material 42b deposited on signal conductor 21b on the other side of gap 32. In one implementation, gap 32 is filled with air. The area under dielectric material 42b forms the second conductive side of capacitor 42. Second capacitor 46 is mounted on conductive blocks 48a and 48b to suspend second capacitor 46 over first capacitor 42. In one implementation, UBCA 200 includes short-as-possible conductive blocks 48a and 48b to separate first and second capacitors 42 and 46. In one implementation, metallized blocks of height slightly larger than the height of first capacitor 42 can be used as stand offs from the bottom end terminals of second capacitor 46. In another implementation, conductive ribbons can be welded to the bottom terminals of second capacitor 46. In other implementations, second capacitor 46 can be mounted directly on top of the first capacitor.

In a further implementation, a high frequency broad side coupled capacitor can be mounted on the bottom side of the CPW substrate 30 instead of on the top surface of the CPW signal conductor (e.g., signal conductor 21). The broad side coupled capacitor can have a width substantially identical to the width of the signal conductor. The length of the broad side coupled capacitor can be varied to provide a desired capacitance value. A conductive lead can be used to electrically connect one side of the broad side coupled capacitor to the signal conductor. A second, low frequency capacitor, such as a multi-layer capacitor, can then be mounted on the top surface of CPW 150 as described above with respect to FIG. 2. The length of CPW 150 can be suspended above the package ground forming a gap between the package ground and the substrate providing reduced parasitic effects. One example of a CPW 150 that can be used is a suspended and truncated CPW, which is described in a co-filed application by the same inventors.

In another implementation, multi-layer co-fired ceramic technologies (such as Low Temperature Co-Fired Ceramic and High Temperature Co-Fired Ceramic) are used to form a multi-layer ceramic substrate providing a high frequency capacitor integrated into the circuit substrate. Multi-layer co-fired ceramic technologies allow thin layers of dielectric substance formed from dielectric paste, with different circuit patterns on different layers each etched separately to be co-fired to form a multi-layer ceramic substrate. Consequently, a UBCA can be formed by coupling a low frequency multi-layer capacitor to CPW 150. Using multi-layer co-fired ceramic technologies allows the use of different but compatible dielectric materials for different layers. Other multi-layer fabrication techniques can be used. Other multi-layer fabrication techniques can use ceramic material or laminate materials.

A high dielectric constant can be required to form a broad side coupled capacitor with an adequate capacitance value while the conductor width and gaps produced in the fabrication process can place an upper limit on the dielectric constant.

In one implementation, the UBCA can be used as a DC block operable over an ultra broadband of frequencies. A DC block can be used to form a bias tee arrangement including an inductor assembly such as an ultra broadband inductor assembly, one example of which is described in a U.S. patent application filed Feb. 11, 2004, by the same inventors and assigned to Oplink Communications, Inc. entitled "Ultra Broadband Inductor Assembly."

A number of implementations have been described. Nevertheless, it will be understood that various modifications may be made without departing from the spirit and scope of the specification. Accordingly, other implementations are within the scope of the following claims.

What is claimed is:

1. A broadband capacitor assembly, comprising:
 a first capacitor operable to provide a first end of an operational band of frequencies within an operational band of a broadband capacitor assembly; and
 a second capacitor coupled in parallel to the first capacitor, the second capacitor operable to provide a second end of the operational band of frequencies within the operational band of the broadband capacitor assembly.

2. The broadband capacitor assembly of claim 1, wherein the first capacitor is operable to provide a high frequency end of the operational band of the broadband capacitor assembly.

3. The broadband capacitor assembly of claim 1, wherein the first capacitor is operable to provide an intermediary frequency end of the operational band of the broadband capacitor assembly.

4. The broadband capacitor assembly of claim 1, wherein the second capacitor is operable to provide a low frequency end of the operational band of the broadband capacitor assembly.

5. The broadband capacitor assembly of claim 1, wherein the first capacitor is a beam-lead capacitor.

6. The broadband capacitor assembly of claim 1, wherein the first capacitor has a value of substantially 20 pF.

7. The broadband capacitor assembly of claim 1, wherein the second capacitor is a multi-layer capacitor.

8. The broadband capacitor assembly of claim 1, wherein the second capacitor has a value of substantially 100 nF.

9. The broadband capacitor assembly of claim 1, wherein the first capacitor has a high quality factor.

10. The broadband capacitor assembly of claim 1, wherein the first capacitor is a thin film capacitor.

11. The broadband capacitor assembly of claim 10, wherein the first capacitor comprises:
 a thin film metallization formed on an alumnia substrate;
 a silicon nitride dielectric coupled to a top surface of the thin film metallization; and
 a second metal coupled to a top surface of the silicon nitride dielectric.

12. The broadband capacitor assembly of claim 1, further comprising:
 a coplanar waveguide structure defining a transmission path having a signal conductor, wherein the first capacitor and the second capacitor are coupled across a gap formed in the signal conductor along the transmission path.

13. The broadband capacitor assembly of claim 12, wherein the second capacitor is positioned below the signal conductor of the coplanar waveguide.

14. The broadband capacitor assembly of claim 13, further comprising:
 conductive leads coupled between the second capacitor and the signal conductor operable to couple the second capacitor across the gap formed in the signal conductor along the transmission path.

15. The broadband capacitor assembly of claim 12, wherein the second capacitor is positioned above the first capacitor.

16. The broadband capacitor assembly of claim 15, further comprising:

one or more conductive blocks coupled between the signal conductor of the coplanar waveguide and the second capacitor operable to couple the second capacitor across the gap formed in the signal conductor along the transmission path.

17. The broadband capacitor of claim 12, wherein the second capacitor is positioned to reduce parasitics that effect a high frequency operation of the first capacitor.

18. The broadband capacitor assembly of claim 12, wherein the first capacitor directly contacts the signal conductor of the coplanar waveguide.

19. The broadband capacitor assembly of claim 12, wherein the first capacitor is a broad side coupled capacitor positioned below a substrate of the coplanar waveguide.

20. The broadband capacitor assembly of claim 12, wherein the coplanar waveguide is mounted to a package ground.

21. The broadband capacitor assembly of claim 20, wherein at least a portion of the coplanar waveguide is suspended above the package ground by an air gap.

22. The broadband capacitor assembly of claim 20, wherein the second capacitor is suspended from a bottom of the coplanar waveguide into a cavity formed in the package ground.

23. A DC block, comprising:

a broadband capacitor assembly, including:

a first capacitor operable to provide a first end of an operational band of frequencies within an operational band of a broadband capacitor assembly; and a second capacitor coupled in parallel to the first capacitor, the second capacitor operable to provide a second end of the operational band of frequencies within the operational band of the broadband capacitor assembly.

24. The DC block of claim 23, wherein the first capacitor is operable to provide a high frequency end of the operational band of the broadband capacitor assembly.

25. The DC block of claim 23, wherein the first capacitor is operable to provide an intermediary frequency end of the operational band of the broadband capacitor assembly.

26. The DC block of claim 23, wherein the second capacitor is operable to provide a low frequency end of the operational band of the broadband capacitor assembly.

27. The DC block of claim 23, wherein the first capacitor is a beam-lead capacitor.

28. The DC block of claim 23, wherein the first capacitor has a value of substantially 20 pF.

29. The DC block of claim 23, wherein the second capacitor is a multi-layer capacitor.

30. The DC block of claim 23, wherein the second capacitor has a value of substantially 100 nF.

31. The DC block of claim 23, wherein the first capacitor has a high quality factor.

32. The DC block of claim 23, wherein the first capacitor is a thin film capacitor.

33. The DC block of claim 32, wherein the first capacitor comprises:

a thin film metallization formed on an alumnia substrate;

a silicon nitride dielectric coupled to a top surface of the thin film metallization; and a second metal coupled to a top surface of the silicon nitride dielectric.

34. The DC block of claim 23, further comprising:

a coplanar waveguide structure defining a transmission path having a signal conductor, wherein the first capacitor and the second capacitor are coupled across a gap formed in the signal conductor along the transmission path.

35. The DC block of claim 34, wherein the second capacitor is positioned below the signal conductor of the coplanar waveguide.

36. The DC block of claim 35, further comprising:

conductive leads coupled between the second capacitor and the signal conductor operable to couple the second capacitor across the gap formed in the signal conductor along the transmission path.

37. The DC block of claim 34, wherein the second capacitor is positioned above the first capacitor.

38. The DC block of claim 37, further comprising:

one or more conductive blocks coupled between the signal conductor of the coplanar waveguide and the second capacitor operable to couple the second capacitor across the gap formed in the signal conductor along the transmission path.

39. The DC block of claim 34, wherein the second capacitor is positioned to reduce parasitics that effect a high frequency operation of the first capacitor.

40. The DC block of claim 34, wherein the first capacitor directly contacts the signal conductor of the coplanar waveguide.

41. The DC block of claim 34, wherein the first capacitor is a broad side coupled capacitor positioned below a substrate of the coplanar waveguide.

42. The DC block of claim 34, wherein the coplanar waveguide is mounted to a package ground.

43. The DC block of claim 42, wherein at least a portion of the coplanar waveguide is suspended above the package ground by an air gap.

44. The DC block of claim 42, wherein the second capacitor is suspended from a bottom of the coplanar waveguide into a cavity formed in the package ground.

* * * * *